United States Patent
Kim et al.

(10) Patent No.: US 7,705,627 B1
(45) Date of Patent: Apr. 27, 2010

(54) SEMICONDUCTOR DEVICE USING POWER GATING

(75) Inventors: Suhwan Kim, Seoul (KR); Chang-jun Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/288,249

(22) Filed: Oct. 17, 2008

(51) Int. Cl.
    *H03K 19/003* (2006.01)
(52) U.S. Cl. .......................................... 326/34; 326/27
(58) Field of Classification Search .................. 326/26, 326/27, 31–34, 82
    See application file for complete search history.

(56) References Cited

U.S. PATENT DOCUMENTS

| | | | |
|---|---|---|---|
| 6,624,687 B1 | 9/2003 | Burr | |
| 6,876,252 B2 | 4/2005 | Kim et al. | |
| 6,977,519 B2 | 12/2005 | Bhavnagarwala et al. | |
| 7,138,825 B2 | 11/2006 | Kim et al. | |
| 2005/0242862 A1 | 11/2005 | Won et al. | |
| 2007/0152706 A1* | 7/2007 | Seo et al. | 326/34 |
| 2008/0224729 A1* | 9/2008 | Afghahi et al. | 326/33 |
| 2008/0278191 A1* | 11/2008 | Kawa | 326/26 |

FOREIGN PATENT DOCUMENTS

KR 10-2005-0104530 A 11/2005

* cited by examiner

*Primary Examiner*—Don P Le
(74) *Attorney, Agent, or Firm*—Mills & Onello, LLP

(57) ABSTRACT

A semiconductor device using power gating includes a circuit unit and a current blocking unit. The circuit unit is connected between a first voltage node and a virtual voltage node. The current blocking unit is connected between the virtual voltage node and a second voltage node, and can block a leakage current of the circuit unit in a standby mode. Also, the current blocking unit controls whether or not to connect the virtual voltage node and the second voltage node in response to a plurality of random signals whose logic states are randomly transited when the standby mode is switched to an active mode. The semiconductor device can minimize ground bounce noise and can stably apply a voltage to a circuit storing data in a data retention mode.

14 Claims, 5 Drawing Sheets

SEMICONDUCTOR DEVICE USING POWER GATING

BACKGROUND

The inventive concept relates to a semiconductor device, and more particularly, to a semiconductor device that uses power gating.

Due to the nanoscale nature of semiconductor processing, power consumption sharply increases due to leakage current. In order to reduce the leakage current, a technique referred to as power gating is used to cut off power supplied to a circuit block that is not currently used in a chip. However, the technique has drawbacks in that data stored in a flip-flop or in a memory is damaged due to the power being cut off. Also, inductive noise may occur in the chip since a current instantaneously rapidly flows when power is re-supplied to re-use the circuit block. The inductive noise is known as ground bounce noise which affects adjacent circuit blocks, and which may cause abnormal operation.

SUMMARY

The inventive concept provides a semiconductor device using power gating so that ground bounce noise can be minimized and a voltage can be stably applied to a circuit storing data in a data retention mode.

According to an aspect, there is provided a semiconductor device including a circuit unit and a current blocking unit. The circuit unit may be connected between a first voltage node and a virtual voltage node. The current blocking unit may be connected between the virtual voltage node and a second voltage node, and may block a leakage current of the circuit unit in a standby mode. Also, the current blocking unit may control whether or not to connect the virtual voltage node and the second voltage node in response to a plurality of random signals whose logic states are randomly transited when the standby mode is switched to an active mode.

The current blocking unit may include a plurality of transistors serially connected between the virtual voltage node and the second voltage node, each transistor having a gate to which a corresponding random signal from among the plurality of random signals is applied; and at least one capacitor having a first terminal connected to a node between the plurality of transistors which are serially connected and a second terminal to which a ground voltage is applied. In one embodiment, the transistors are NMOS transistors, a power voltage is applied to the first voltage node, and a ground voltage is applied to the second voltage node. In an alternative embodiment, the transistors are PMOS transistors, a ground voltage is applied to the first voltage node, and a power voltage is applied to the second voltage node.

The current blocking unit may include a plurality of transistors having first terminals connected to the virtual voltage node, having second terminals connected to the second voltage node, and having gates to which corresponding random signals from among the plurality of random signals are applied.

The semiconductor device may further include a random signal generating unit generating the plurality of random signals.

In one embodiment, the plurality of random signals comprise first through $n_{th}$ random signals (n is a natural number greater than 2), wherein a $k_{th}$ random signal (k is a natural number in a range of 2 through n) is a signal generated by shifting the first random signal during a k time period.

The semiconductor device may further include a current pass unit connecting the virtual voltage node and the second voltage node in a data retention mode; and a charge pump allowing a predetermined current to flow between the virtual voltage node and the second voltage node in the data retention mode, wherein the current pass unit is connected in parallel with the current blocking unit and the charge pump.

The current pass unit may be an NMOS transistor connected between the virtual voltage node and the second voltage node, and turned on in the data retention mode. The charge pump may comprise: a PMOS transistor turned on or turned off in the data retention mode; and a current source connected to the PMOS transistor.

The current pass unit may be a PMOS transistor connected between the virtual voltage node and the second voltage node, and turned on in the data retention mode. The charge pump may comprise: a NMOS transistor turned on or turned off in the data retention mode; and a current source connected to the NMOS transistor.

The current blocking unit may block connection between the virtual voltage node and the second voltage node in the data retention mode.

The current blocking unit may maintain connection between the virtual voltage node and the second voltage node when a voltage of the virtual voltage node equals a voltage of the second voltage node.

BRIEF DESCRIPTION OF THE DRAWINGS

Exemplary embodiments of the inventive concept will be more clearly understood from the following detailed description taken in conjunction with the accompanying drawings.

DETAILED DESCRIPTION OF THE EMBODIMENTS

Figure 1:
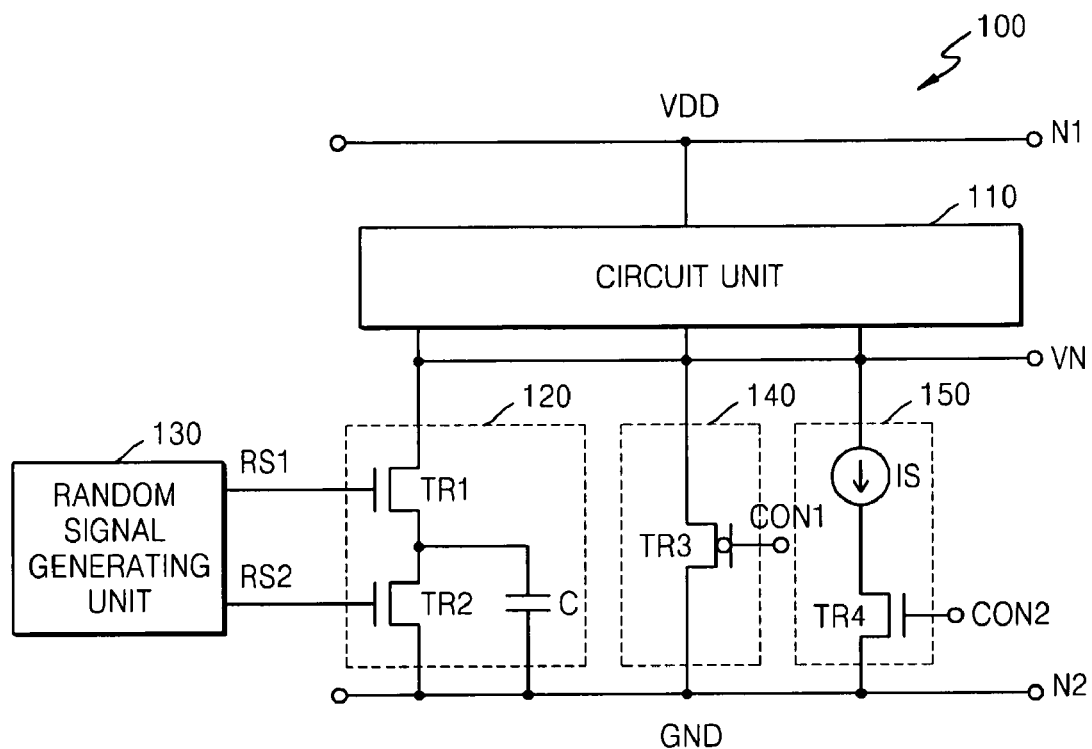
FIG. 1 is a block diagram of a semiconductor device according to an embodiment of the inventive concept.

Embodiments of the inventive concept will now be described more fully with reference to the accompanying drawings, in which exemplary embodiments of the inventive concept are shown. Like reference numerals in the drawings denote like elements.

FIG. 1 is a block diagram of a semiconductor device 100 according to an embodiment of the inventive concept.

Referring to FIG. 1, the semiconductor device 100 according to the present embodiment may include a circuit unit 110, a current blocking unit 120, and a random signal generating unit 130. The circuit unit 110 is connected between a first voltage node N1 and a virtual voltage node VN. In the current embodiment of FIG. 1, it is assumed that a power voltage VDD is applied to the first voltage node N1. The circuit unit 110 may be a logic block that performs general circuit operations, or may be a storage block that stores data.

The current blocking unit 120 is connected between the virtual voltage node VN and a second voltage node N2. In the current embodiment of FIG. 1, it is assumed that a ground voltage GND is applied to the second voltage node N2. The current blocking unit 120 may include first and second transistors TR1 and TR2, and at least a capacitor C. In the current embodiment of FIG. 1, the current blocking unit 120 includes the first and second transistors TR1 and TR2, and the capacitor C. However, the inventive concept is not limited thereto, and even if the number of transistors and capacitors included in the current blocking unit 120 varies, an effect of the current embodiment of the inventive concept remains unchanged. The first transistor TR1 may be an N-type metal-oxide-semiconductor (NMOS) transistor. A first terminal of the first transistor TR1 is connected to the virtual voltage node VN, a second terminal thereof is connected to a first terminal of the second transistor TR2 and a first terminal of the capacitor C, and a first random signal RS1 is applied to a gate of the first transistor TR1. The second transistor TR2 may be an NMOS transistor. The first terminal of the second transistor TR2 is connected to the second terminal of the first transistor TR1 and the first terminal of the capacitor C. A second terminal of the second transistor TR2 is connected to the second voltage node N2, and a second random signal RS2 is applied to a gate of the second transistor TR2. The first terminal of the capacitor C is connected to the second terminal of the first transistor TR1 and the first terminal of the second transistor TR2, and the ground voltage GND is applied to a second terminal of the capacitor C.

The current blocking unit 120 blocks connection between the circuit unit 110 and the second voltage node N2 in a standby mode, thereby blocking a leakage current that may be generated in the circuit unit 110. That is, in the standby mode, the first and second transistors TR1 and TR2 are constantly maintained in a turn-off state. When the standby mode is shifted to an active mode, the current blocking unit 120 controls whether or not to connect the virtual voltage node VN and the second voltage node N2 in response to the first and second random signals RS1 and RS2.

In the standby mode, the virtual voltage node VN transits to a floating state, and thus, due to a leakage current, the virtual voltage node VN may have a voltage similar to the power voltage VDD, not the ground voltage GND. Thus, in the case where the first and second transistors TR1 and TR2 are turned on so as to shift the standby mode to the active mode, a large current flows in the first and second transistors TR1 and TR2. In this manner, when the amount of a current is instantaneously sharply changed, ground bounce noise is generated. Ground bounce noise is noise occurring when a large current instantaneously flows to a parasitic inductance component in a bonding wire and a power distribution network. In the current embodiment illustrated in FIG. 1, the ground bounce noise may be minimized by randomly turning on or off the first and second transistors TR1 and TR2. In the case where the first transistor TR1 is in a turn-on state and the second transistor TR2 is in a turn-off state, the capacitor C is charged. In the case where the first transistor TR1 is in a turn-off state and the second transistor TR2 is in a turn-on state, the electric charges stored in the capacitor C are discharged. In the case where both the first and second transistors TR1 and TR2 are in a turn-on state, a current flows from the virtual voltage node VN to the second voltage node N2. The aforementioned three cases randomly occur in the current blocking unit 120 so that the voltage of the virtual voltage node VN slowly transits to the ground voltage GND. That is, by slowly transiting the voltage of the virtual voltage node VN, the ground bounce noise may be minimized. When the voltage of the virtual voltage node VN transits to a voltage similar to the ground voltage GND of the second voltage node N2, the current blocking unit 120 continuously turns on the first and second transistors TR1 and TR2 so as to maintain connection between the virtual voltage node VN and the second voltage node N2, so that the semiconductor device 100 operates in the active mode.

The random signal generating unit 130 may generate the first and second random signals RS1 and RS2 whose logic states are randomly transited. That is, the first and second random signals RS1 and RS2 randomly transit to either a first logic state or a second logic state. Hereinafter, the first logic state is defined as a first logic high and the second logic state is defined as a second logic low. However, even though the first logic state can mean the second logic high and the second logic state means the first logic low, an effect of the current embodiment of the inventive concept remains unchanged. In the current embodiment of FIG. 1, two random signals, that is, the first and second random signals RS1 and RS2 are generated. However, if required, the number of random signals to be possibly generated by the random signal generating unit 130 may vary. Also, the random signals may be completely random with respect to each other, or may have a predetermined rule among the random signals. For example, in the case where the random signal generating unit 130 generates first through $n_{th}$ random signals (n is a natural number greater than 2), a first random signal may be a signal whose logic state is randomly transited, and a second random signal may be a signal generated by shifting the first random signal during a first time period that is a predetermined time period. That is, a $k_{th}$ random signal (k is a natural number in a range of 2 through n) may be a signal generated by shifting the first random signal during a k time period that is a predetermined time period.

The semiconductor device 100 may further include a current pass unit 140 and a charge pump 150 so as to stably apply a voltage to the circuit unit 110 in a data retention mode. The data retention mode is a status in which power is not cut off and a clock signal is not applied. For example, in the data retention mode, when the current blocking unit 120 blocks connection between the virtual voltage node VN and the second voltage node N2, the virtual voltage node VN should have a predetermined voltage so as to retain data stored in the circuit unit 110. Hereinafter, a minimum voltage, which should be applied to the circuit unit 110 so as to retain the data in the data retention mode, is referred to as a retention voltage.

The current pass unit 140 controls whether or not to connect the virtual voltage node VN and the second voltage node N2. That is, the current pass unit 140 may include a third transistor TR3 having a first terminal connected to the virtual voltage node VN, and a second terminal connected to the second voltage node N2. A first control signal CON1 is applied to the gate of the third transistor TR3. The current pass unit 140 may be a P-type metal-oxide-semiconductor (PMOS) transistor. In the data retention mode, the first control signal CON1 transits to a second logic state, thereby turning on the third transistor TR3.

The charge pump 150 is connected between the virtual voltage node VN and the second voltage node N2, thereby allowing a predetermined current to flow between the virtual voltage node VN and the second voltage node N2 in the data retention mode. The charge pump 150 may include a current source IS and a fourth transistor TR4. The current source IS is connected between the virtual voltage node VN and the fourth transistor TR4. The fourth transistor TR4 may be an NMOS transistor having a first terminal connected to the current source IS, and a second terminal connected to the second voltage node N2. A second control signal CON2 is applied to the gate of the fourth transistor TR4. Even if the position of the current source IS may be switched to the position of the fourth transistor TR4, an effect of the current embodiment of the inventive concept remains unchanged. That is, the first terminal of the fourth transistor TR4 may be connected to the virtual voltage node VN, the second terminal of the fourth transistor TR4 may be connected to a first terminal of the current source IS, and a second terminal of the current source IS may be connected to the second voltage node N2. The second control signal CON2 is in a first logic state or in a second logic state in the data retention mode.

The voltage of the virtual voltage node VN varies according to the amount of process variation temperature (PVT) variation. Thus, when the voltage of the virtual voltage node VN increases, the second control signal CON2 transits to the first logic state so as to allow a current to flow via the charge pump 150. When the voltage of the virtual voltage node VN decreases, the second control signal CON2 transits to the second logic state so as to allow the current not to flow via the charge pump 150. In this manner, the voltage of the virtual voltage node VN is constantly maintained so that the retention voltage may be stably applied to the circuit unit 110. In the data retention mode, the first and second transistors TR1 and TR2 of the current blocking unit 120 may be in a turn-off state.

Figure 2:
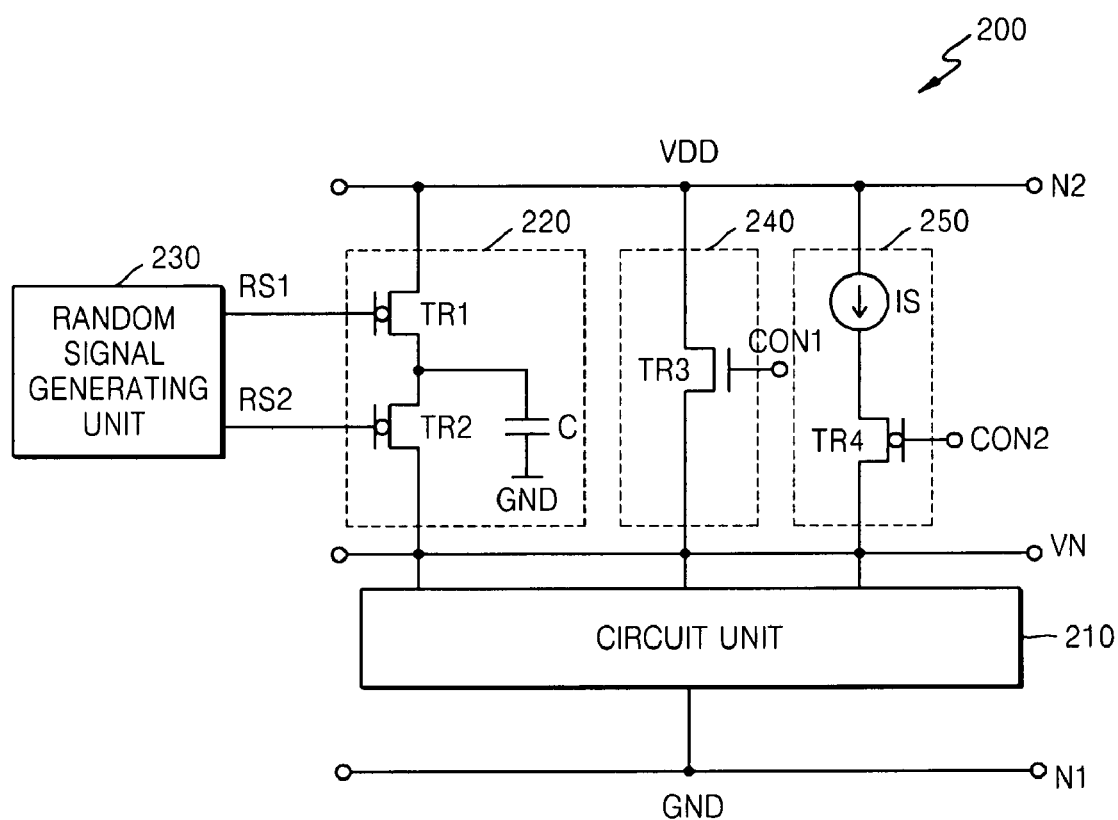
FIG. 2 is a block diagram of a semiconductor device according to another embodiment of the inventive concept.

FIG. 2 is a block diagram of a semiconductor device 200 according to another embodiment of the inventive concept.

Referring to FIG. 2, the semiconductor device 200 according to the present embodiment may include a circuit unit 210, a current blocking unit 220, and a random signal generating unit 230. The circuit unit 210 is connected between a first voltage node N1 and a virtual voltage node VN. In the current embodiment of FIG. 2, it is assumed that a ground voltage GND is applied to the first voltage node N1. The circuit unit 210 may operate similarly to the circuit unit 110 of FIG. 1.

The current blocking unit 220 is connected between the virtual voltage node VN and a second voltage node N2. In the current embodiment of FIG. 2, it is assumed that a power voltage VDD is applied to the second voltage node N2. The current blocking unit 220 may include first and second transistors TR1 and TR2, and at least a capacitor C. Similar to the embodiment illustrated in FIG. 1, the number of transistors and capacitors included in the current blocking unit 220 may be varied without changing an effect of the current embodiment of the inventive concept. The first transistor TR1 may be a PMOS transistor having a first terminal connected to the second voltage node N2, and a second terminal connected to a first terminal of the second transistor TR2 and a first terminal of the capacitor C. A first random signal RS1 is applied to a gate of the first transistor TR1. The second transistor TR2 may be a PMOS transistor having a first terminal connected to the second terminal of the first transistor TR1 and the first terminal of the capacitor C, and a second terminal connected to the virtual voltage node VN. A second random signal RS2 is applied to a gate of the second transistor TR2. The first random signal RS1 and the second random signal RS2 are signals whose logic states are randomly transited. The first terminal of the capacitor C is connected to the second terminal of the first transistor TR1 and the first terminal of the second transistor TR2, and a ground voltage GND is applied to a second terminal of the capacitor C.

The current blocking unit 220 operates similarly to the current blocking unit 120 of FIG. 1. That is, the current blocking unit 220 blocks connection between the circuit unit 210 and the second voltage node N2 in the standby mode, and when the standby mode is shifted to the active mode, the current blocking unit 220 controls whether or not to connect the virtual voltage node VN and the second voltage node N2 in response to the first and second random signals RS1 and RS2.

In the current embodiment of FIG. 2, the virtual voltage node VN transits to a floating state in the standby mode, and thus, due to a leakage current, the virtual voltage node VN may have a voltage similar to the ground voltage GND, not the power voltage VDD. Thus, in the case where the first and second transistors TR1 and TR2 are turned on so as to shift the standby mode to the active mode, a large current flows in the first and second transistors TR1 and TR2, thereby generating ground bounce noise. Similar to the embodiment illustrated in FIG. 1, the semiconductor device 200 of FIG. 2 controls the first and second transistors TR1 and TR2 to be randomly turned on or off in response to the first and second random signals RS1 and RS2, thereby controlling a voltage of the virtual voltage node VN to slowly transit to the power voltage VDD. That is, by slowly transiting the voltage of the virtual voltage node VN, the ground bounce noise may be minimized. When the voltage of the virtual voltage node VN transits to a voltage similar to the power voltage VDD of the second voltage node N2, the current blocking unit 220 continuously turns on the first and second transistors TR1 and TR2 so as to maintain connection between the virtual voltage node VN and the second voltage node N2, so that the semiconductor device 200 operates in the active mode.

The random signal generating unit 230 operates similarly to the random signal generating unit 130 of FIG. 1, and thus, a detailed description thereof will not be repeated here.

The semiconductor device 200 may further include a current pass unit 240 and a charge pump 250 so as to stably apply a voltage to the circuit unit 210 in the data retention mode.

The current pass unit 240 controls whether or not to connect the virtual voltage node VN and the second voltage node N2. That is, the current pass unit 240 may include a third transistor TR3 having a first terminal connected to the second voltage node N2, and a second terminal connected to the virtual voltage node VN. A first control signal CON1 is applied to a gate of the third transistor TR3. The current pass unit 140 may be a NMOS transistor. In the data retention mode, the first control signal CON1 transits to a first logic state, thereby turning on the third transistor TR3.

The charge pump 250 is connected between the virtual voltage node VN and the second voltage node N2, thereby allowing a predetermined current to flow between the virtual voltage node VN and the second voltage node N2 in the data retention mode. The charge pump 250 may include a current source IS and a fourth transistor TR4. The current source IS is connected between the second voltage node N2 and the fourth transistor TR4. The fourth transistor TR4 may be a PMOS transistor having a first terminal connected to the current source IS, and a second terminal connected to the virtual voltage node VN. A second control signal CON2 is applied to a gate of the fourth transistor TR4. Similar to the embodiment illustrated in FIG. 1, the position of the current source IS may be switched to the position of the fourth transistor TR4 without changing an effect of the current embodiment of the inventive concept.

The second control signal CON2 is in a first logic state or at a second logic state in the data retention mode.

The voltage of the virtual voltage node VN varies according to the amount of the PVT variation, as described above. Thus, when the voltage of the virtual voltage node VN decreases, the second control signal CON2 transits to the second logic state so as to allow a current to flow via the charge pump 250. When the voltage of the virtual voltage node VN increases, the second control signal CON2 transits to the first logic state so as to allow the current not to flow via the charge pump 250. In this manner, the voltage of the virtual voltage node VN is constantly maintained in the data retention mode so that the retention voltage may be stably applied to the circuit unit 210. In the data retention mode, the first and second transistors TR1 and TR2 of the current blocking unit 220 may be in a turn-off state.

Figure 3:
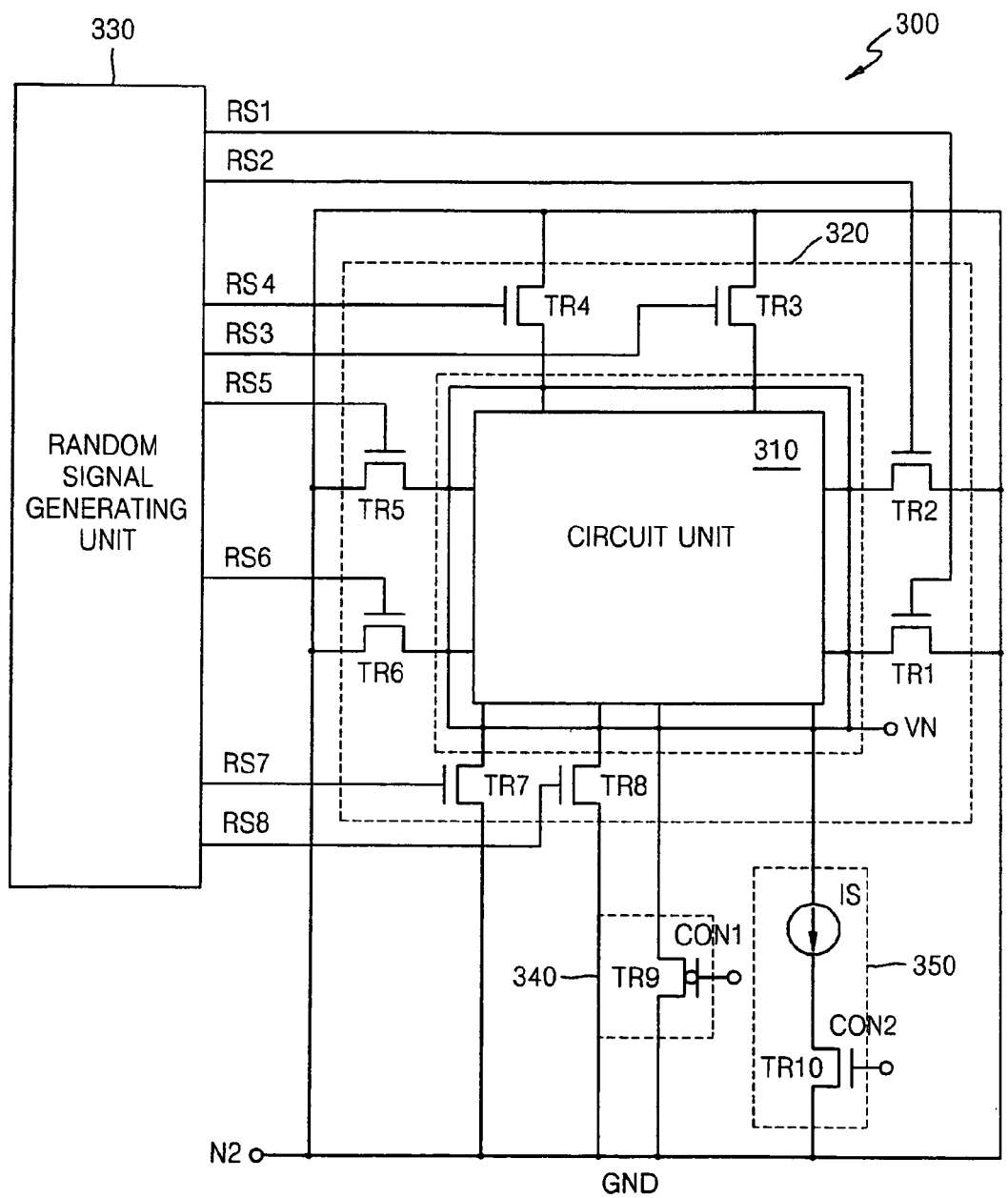
FIG. 3 is a block diagram of a semiconductor device according to another embodiment of the inventive concept.

FIG. 3 is a block diagram of a semiconductor device 300 according to another embodiment of the inventive concept.

Referring to FIG. 3, the semiconductor device 300 according to the present embodiment may include a circuit unit 310, a current blocking unit 320, and a random signal generating unit 330. The circuit unit 310 is similar to the circuit unit 110 of FIG. 1, and thus, a detailed description thereof will not be repeated here.

The current blocking unit 320 is connected between a virtual voltage node VN and a second voltage node N2. In the current embodiment of FIG. 3, it is assumed that a ground voltage GND is applied to the second voltage node N2. The current blocking unit 320 may include first through eighth transistors TR1 through TR8 connected in parallel with one another. However, the inventive concept is not limited thereto, and the number of transistors included in the current blocking unit 320 may vary without changing an effect of the current embodiment of the inventive concept. The first transistor TR1 may be an NMOS transistor having a first terminal connected to the virtual voltage node VN, and a second terminal connected to the second voltage node N2. A first random signal RS1 is applied to a gate of the first transistor TR1. Similarly, each of the second through eighth transistors TR2 through TR8 may be an NMOS transistor having a first terminal connected to the virtual voltage node VN, and a second terminal connected to the second voltage node N2. Second through eighth random signals RS2 through RS8 are applied to the gates of the second through eighth transistors TR2 through TR8, respectively.

When the standby mode is shifted to the active mode, the current blocking unit 320 controls whether or not to connect the virtual voltage node VN and the second voltage node N2 in response to the first through eighth random signals RS1 through RS8. As described above, when the standby mode is shifted to the active mode, the amount of current variation instantaneously sharply increases, thereby generating ground bounce noise. In the current embodiment of FIG. 3, the ground bounce noise may be minimized by randomly turning on or off the first through eighth transistors TR1 through TR8. That is, since the first through eighth transistors TR1 through TR8 are randomly turned on or off, a large current does not instantaneously flow so that a voltage of the virtual voltage node VN may slowly transit to the ground voltage GND and the ground bounce noise may be minimized. When the voltage of the virtual voltage node VN transits to a voltage similar to the ground voltage GND of the second voltage node N2, the current blocking unit 320 continuously turns on the first through eighth transistors TR1 through TR8 so as to maintain connection between the virtual voltage node VN and the second voltage node N2, so that the semiconductor device 300 operates in the active mode.

Unlike in the embodiment illustrated in FIG. 1, the random signal generating unit 330 according to the present embodiment generates eight random signals, that is, the first through eighth random signals RS1 through RS8. As described in relation to the embodiment illustrated in FIG. 1, if required, the number of random signals to be possibly generated by the random signal generating unit 330 may vary. Thus, a detailed description thereof will not be repeated here.

The semiconductor device 300 may further include a current pass unit 340 and a charge pump 350 so as to stably apply a voltage to the circuit unit 310 in the data retention mode. The current pass unit 340 and the charge pump 350 have similar structures and operate similarly to the current pass unit 140 and the charge pump 150 of FIG. 1. Thus, detailed descriptions thereof will not be provided here.

Figure 4:
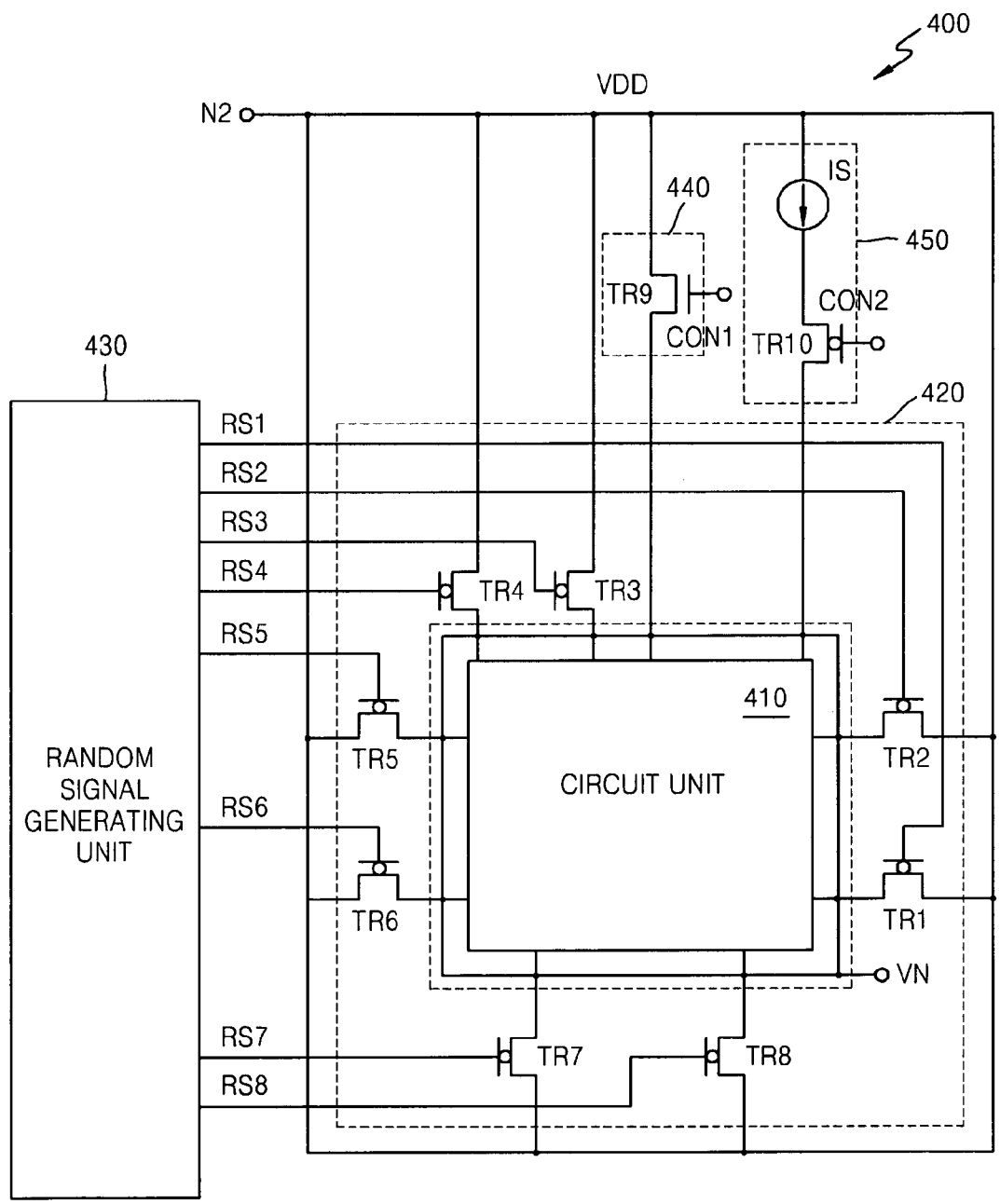
FIG. 4 is a block diagram of a semiconductor device according to another embodiment of the inventive concept.

FIG. 4 is a block diagram of a semiconductor device 400 according to another embodiment of the inventive concept.

Referring to FIG. 4, the semiconductor device 400 according to the present embodiment may include a circuit unit 410, a current blocking unit 420, and a random signal generating unit 430. The circuit unit 410 is similar to the circuit unit 210 of FIG. 2, and thus, a detailed description thereof will not be repeated here.

The current blocking unit 420 is connected between a virtual voltage node VN and a second voltage node N2. In the current embodiment of FIG. 4, it is assumed that a power voltage VDD is applied to the second voltage node N2. The current blocking unit 420 may include first through eighth transistors TR1 through TR8 which are connected in parallel with one another. Similar to the embodiment illustrated in FIG. 3, the current blocking unit 420 includes eight transistors, that is, the first through eighth transistors TR1 through TR8. However, the inventive concept is not limited thereto, and the number of transistors included in the current blocking unit 420 may be varied without changing an effect of the current embodiment of the inventive concept. The first transistor TR1 may be an NMOS transistor having a first terminal connected to the second voltage node N2, and a second terminal connected to the virtual voltage node VN. A first random signal RS1 is applied to a gate of the first transistor TR1. Similarly, each of the second through eighth transistors TR2 through TR8 may be a PMOS transistor having a first terminal connected to the second voltage node N2, and a second terminal connected to the virtual voltage node VN. Second through eighth random signals RS2 through RS8 are applied to the gates of the second through eighth transistors TR2 through TR8, respectively.

When the standby mode is shifted to the active mode, the current blocking unit 420 controls whether or not to connect the virtual voltage node VN and the second voltage node N2 in response to the first through eighth random signals RS1 through RS8. As described above, when the standby mode is shifted to the active mode, the amount of current variation instantaneously sharply increases, thereby generating ground bounce noise. In the current embodiment of FIG. 4, the ground bounce noise may be minimized by randomly turning on or off the first through eighth transistors TR1 through TR8. That is, since the first through eighth transistors TR1 through TR8 are randomly turned on or off, a large current does not instantaneously flow so that a voltage of the virtual voltage node VN may slowly transit to the power voltage VDD and the ground bounce noise may be minimized. When the voltage of the virtual voltage node VN transits to a voltage similar to the power voltage VDD of the second voltage node N2, the current blocking unit 420 continuously turns on the first through eighth transistors TR1 through TR8 so as to maintain connection between the virtual voltage node VN and the second voltage node N2, so that the semiconductor device 400 operates in the active mode.

The random signal generating unit 430 may operate similarly to the random signal generating unit 330 of FIG. 3, and thus, a detailed description thereof will not be repeated here.

The semiconductor device 400 may further include a current pass unit 440 and a charge pump 450 so as to stably apply a voltage to the circuit unit 410 in the data retention mode. The current pass unit 440 and the charge pump 450 have similar structures and operate similarly to the current pass unit 240 and the charge pump 250 of FIG. 2. Thus, detailed descriptions thereof will not be provided here.

Figure 5:
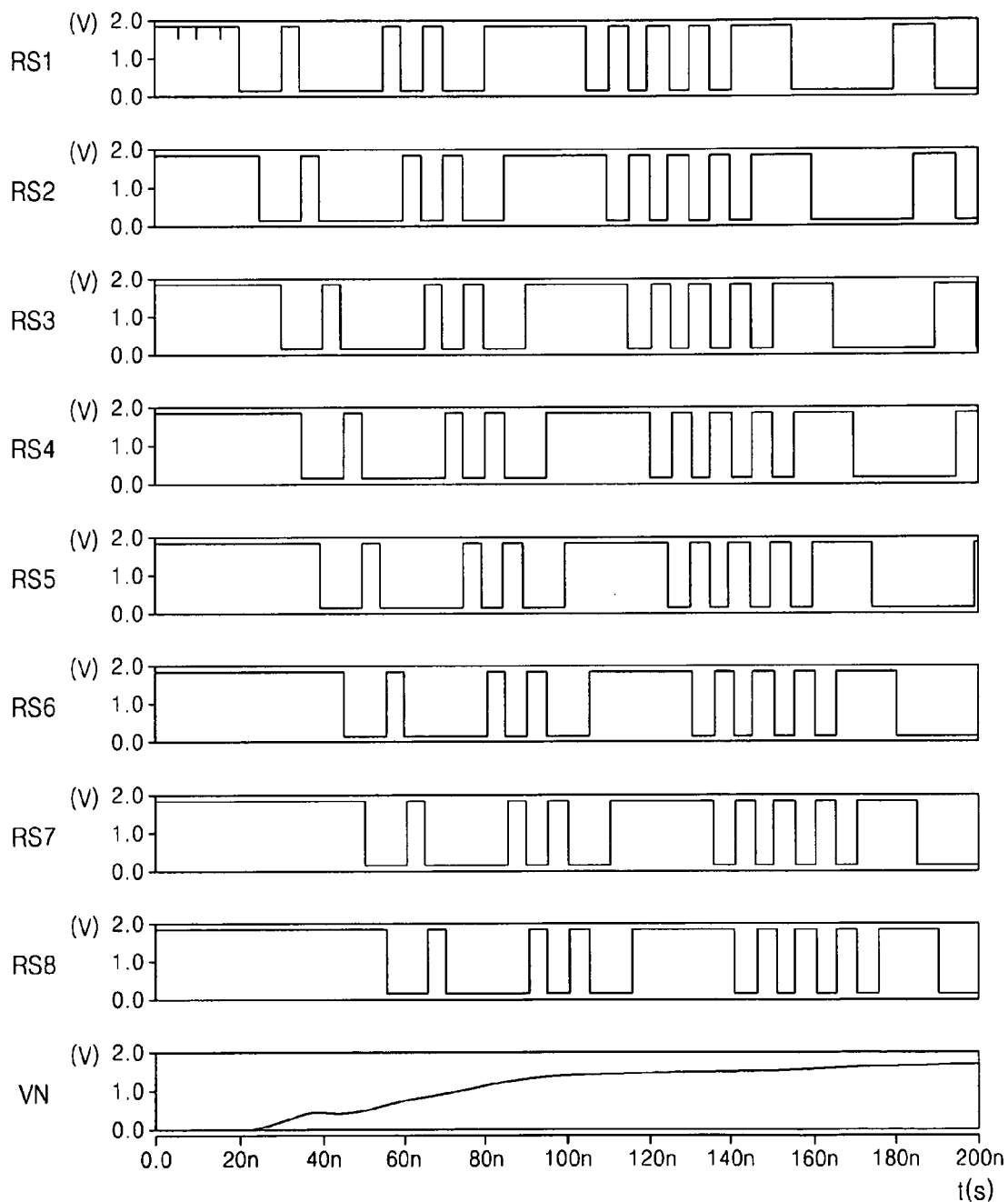
FIG. 5 illustrates waveforms of random signals and voltage variations of a virtual voltage node according to the embodiment of FIG. 4.

FIG. 5 illustrates waveforms of the first through eighth random signals RS1 through RS8 and voltage variations of the virtual voltage node VN according to the embodiment illustrated in FIG. 4.

Referring to FIGS. 4 and 5, when the first through eighth transistors TR1 through TR8 are randomly turned on or off by using the first through eighth random signals RS1 through RS8 as illustrated in FIG. 5, it is apparent that a voltage of the virtual voltage node VN slowly increases from a ground voltage GND to a voltage similar to a power voltage VDD. Thus, the semiconductor device 400 illustrated in FIG. 4 may reduce the ground bounce noise. However, the first through eighth random signals RS1 through RS8 may be used in the embodiment of FIG. 3, and two signals from among the first through eighth random signals RS1 through RS8 may be randomly selected to be used in the embodiment of FIG. 1 or in the embodiment of FIG. 2. The waveforms of the first through eighth random signals RS1 through RS8 of FIG. 5 are an example and the inventive concept is not limited thereto.

The semiconductor device using the power gating according to the inventive concept can reduce current causing ground bounce noise, thereby minimizing the ground bounce noise. Also, in the data retention mode, the semiconductor device can stably apply a voltage to a circuit that stores data, so that the semiconductor device can retain the stored data at a low voltage.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
a circuit unit connected between a first voltage node and a virtual voltage node; and
a current blocking unit connected between the virtual voltage node and a second voltage node, and blocking a leakage current of the circuit unit in a standby mode,
wherein the current blocking unit controls whether or not to connect the virtual voltage node and the second voltage node in response to a plurality of random signals whose logic states are randomly transited when the standby mode is switched to an active mode.

2. The semiconductor device of claim 1, wherein the current blocking unit comprises:
a plurality of transistors serially connected between the virtual voltage node and the second voltage node, each transistor having a gate to which a corresponding random signal from among the plurality of random signals is applied; and
at least one capacitor having a first terminal connected to a node between the plurality of transistors which are serially connected, and a second terminal to which a ground voltage is applied.

3. The semiconductor device of claim 2, wherein the plurality of transistors are NMOS (N-type metal-oxide-semiconductor) transistors, a power voltage is applied to the first voltage node, and a ground voltage is applied to the second voltage node.

4. The semiconductor device of claim 2, wherein the plurality of transistors are PMOS (P-type metal-oxide-semiconductor) transistors, a ground voltage is applied to the first voltage node, and a power voltage is applied to the second voltage node.

5. The semiconductor device of claim 1, wherein the current blocking unit comprises a plurality of transistors having first terminals connected to the virtual voltage node, having second terminals connected to the second voltage node, and having gates to which corresponding random signals from among the plurality of random signals are applied.

6. The semiconductor device of claim 5, wherein the plurality of transistors are NMOS transistors, a power voltage is applied to the first voltage node, and a ground voltage is applied to the second voltage node.

7. The semiconductor device of claim 5, wherein the plurality of transistors are PMOS transistors, a ground voltage is applied to the first voltage node, and a power voltage is applied to the second voltage node.

8. The semiconductor device of claim 1, further comprising a random signal generating unit generating the plurality of random signals.

9. The semiconductor device of claim 1, wherein the plurality of random signals comprise first through $n_{th}$ random signals (n is a natural number greater than 2), wherein a $k_{th}$ random signal (k is a natural number in a range of 2 through n) is a signal generated by shifting the first random signal during a k time period.

10. The semiconductor device of claim 1, further comprising:
a current pass unit connecting the virtual voltage node and the second voltage node in a data retention mode; and
a charge pump allowing a predetermined current to flow between the virtual voltage node and the second voltage node in the data retention mode,
wherein the current pass unit is connected in parallel with the current blocking unit and the charge pump.

11. The semiconductor device of claim 10, wherein the current pass unit is an NMOS transistor connected between the virtual voltage node and the second voltage node, and turned on in the data retention mode,
wherein the charge pump comprises:
a PMOS transistor turned on or turned off in the data retention mode; and
a current source connected to the PMOS transistor.

12. The semiconductor device of claim 10, wherein the current pass unit is an PMOS transistor connected between the virtual voltage node and the second voltage node, and turned on in the data retention mode,
wherein the charge pump comprises:
a NMOS transistor turned on or turned off in the data retention mode; and
a current source connected to the NMOS transistor.

13. The semiconductor device of claim 10, wherein the current blocking unit blocks connection between the virtual voltage node and the second voltage node in the data retention mode.

14. The semiconductor device of claim 1, wherein the current blocking unit maintains connection between the virtual voltage node and the second voltage node when a voltage of the virtual voltage node equals a voltage of the second voltage node.

* * * * *

UNITED STATES PATENT AND TRADEMARK OFFICE
CERTIFICATE OF CORRECTION

PATENT NO. : 7,705,627 B1
APPLICATION NO. : 12/288249
DATED : April 27, 2010
INVENTOR(S) : Suhwan Kim et al.

Page 1 of 1

It is certified that error appears in the above-identified patent and that said Letters Patent is hereby corrected as shown below:

On the Title Page, Item (73) Assignee, insert --Seoul National University Industry Foundation (KR)--

Signed and Sealed this

Twelfth Day of October, 2010

David J. Kappos
*Director of the United States Patent and Trademark Office*